United States Patent
Kister (10) Patent No.: US 7,091,729 B2
(45) Date of Patent: Aug. 15, 2006

(54) CANTILEVER PROBE WITH DUAL PLANE FIXTURE AND PROBE APPARATUS THEREWITH

(75) Inventor: January Kister, Portola Valley, CA (US)

(73) Assignee: Micro Probe, Carlsbad, CA (US)

( * ) Notice: Subject to any disclaimer, the term of this patent is extended or adjusted under 35 U.S.C. 154(b) by 77 days.

(21) Appl. No.: 10/888,347

(22) Filed: Jul. 9, 2004

(65) Prior Publication Data

US 2006/0006887 A1    Jan. 12, 2006

(51) Int. Cl.
*G01R 31/02* (2006.01)

(52) U.S. Cl. ........................ 324/754; 324/761
(58) Field of Classification Search ............. None
See application file for complete search history.

(56) References Cited

U.S. PATENT DOCUMENTS

| | | | |
|---|---|---|---|
| 3,599,093 A | 8/1971 | Oates et al. | 324/158 |
| 3,812,311 A | 5/1974 | Kvaternik | 200/61.42 |
| 4,618,821 A | 10/1986 | Lenz | 324/754 |
| 5,720,098 A | 2/1998 | Kister | 29/825 |
| 5,742,174 A | 4/1998 | Kister et al. | 324/762 |
| 5,764,072 A | 6/1998 | Kister | 324/754 |
| 5,923,178 A * | 7/1999 | Higgins et al. | 324/754 |
| 6,411,112 B1 * | 6/2002 | Das et al. | 324/754 |

* cited by examiner

*Primary Examiner*—Jermele Hollington
(74) *Attorney, Agent, or Firm*—Lumen Intellectual Property Services, Inc.

(57) ABSTRACT

A cantilever probe has an elbow for bonding to a dual plane fixture plate for a highly stiff and precise angled fixture of the bonded cantilever probe with minimal real estate consumption. The cantilever probe may feature a tip positioning pin and an elbow positioning pin fitting into corresponding holes of the fixture plate and a sacrificial assembly plate. Separate fan-out beams may be attached to the fixture plate and conductively connected to respective elbows once the cantilever probes are fixed. The fan-out beams in turn may be conductively connected with their respective peripheral ends to large pitch apparatus terminals of a circuit board. A probe apparatus may be easily customized by providing varying drill patterns of the positioning holes for fan-out beams and cantilever probes to match pitch requirements of the tested circuit chips.

19 Claims, 8 Drawing Sheets

CANTILEVER PROBE WITH DUAL PLANE FIXTURE AND PROBE APPARATUS THEREWITH

CROSS REFERENCE

The present invention cross references the U.S. Patent Application of the same inventor January Kister, titled "Freely Deflecting Knee Probe With Controlled Scrub Motion" filed May 21, 2004, application Ser. No. 10/850,921, which is hereby incorporated by reference.

FIELD OF INVENTION

The present invention relates to cantilever probes. In particular, the present invention relates to a cantilever probe with angle fixture and a probe apparatus therewith.

BACKGROUND OF INVENTION

Continuing miniaturization of cantilever probes imposes new challenges for their positioning and fixing within a probe apparatus. Cantilever probes are commonly fixed with their peripheral ends having their cantilever portion with the contacting tip free suspended to provide the required flexibility. To provide sufficient positioning accuracy, the fixture portion of the cantilever probe is commonly extensively dimensioned, which in turn consumes extensive real estate forcing multilayer cantilever probe assemblies with varying cantilever geometries. Such varying cantilever geometries result in different deflection behavior and limited average positioning accuracy of all cantilever probes of a probe apparatus. In addition, cantilever probes of the prior art are commonly fixed in a surrounding fashion along a linear fixture element, which requires additional surrounding referencing and/or positioning structures, which in turn consume additional space between the cantilever probes.

Prior art cantilever probes are commonly fabricated with lengthy peripheral structures for a sufficient fanning out between the ever decreasing test contact pitches and circuit board contacts of the probe apparatus. Peripheral fan-out structures may be a multitude of the cantilever portion, which reduces the positioning accuracy of the ever decreasing cantilevers and contacting tips.

For the reasons stated above, there exists a need for a cantilever probe and probe assembly that provides maximum contacting tip accuracy together with homogeneous deflection behavior within a minimum footprint. In addition, cantilever probes may be simple and highly consistent in geometry for inexpensive mass production. Other affiliated structures of the probe apparatus may be inexpensively fabricated to accommodate for highly individualized probe apparatus configurations. The present invention addresses these needs.

SUMMARY

A cantilever probe has an elbow for bonding to a dual plane fixture plate having two substantially non parallel fixture surfaces in an angle corresponding to the elbow. The dual plane angled fixture between elbow and fixture plate provides for a highly stiff and precise hold of the bonded cantilever probe with minimal real estate consumption. The cantilever probe may feature at least two positioning pins one of which may be placed at the contacting tip and the other one may extend from at least one of two contacting faces of the elbow. The elbow positioning pin may fit into a corresponding elbow pin hole on one of the fixture surfaces. The tip positioning pin may fit into a corresponding tip pin hole of a sacrificial assembly plate temporarily combined with the fixture plate for a precise positioning of the cantilever probes during curing, setting or hardening of a bonding agent between the fixture plate an the elbow. After assembly of a number of cantilever probes, the sacrificial plate may be removed and the tip pins eventually sanded to a common plane.

Separate fan-out beams may be aligned with beam positioning pins on and attached to the fixture plate. The fan-out beams are aligned and conductively connected with their probe connect ends to respective probe elbows once the cantilever probes are fixed. The fan-out beams in turn may be conductively connected with their respective peripheral connect ends to well known large pitch apparatus terminals of a circuit board. Cantilever probes and fan-out beams may have geometries suitable for inexpensive mass fabrication by well known masked electro deposition fabrication techniques. A probe apparatus may be easily customized by providing varying drill patterns of the positioning holes for fan-out beams and cantilever probes to match pitch requirements of the tested circuit chips.

DETAILED DESCRIPTION

Figure 1A:
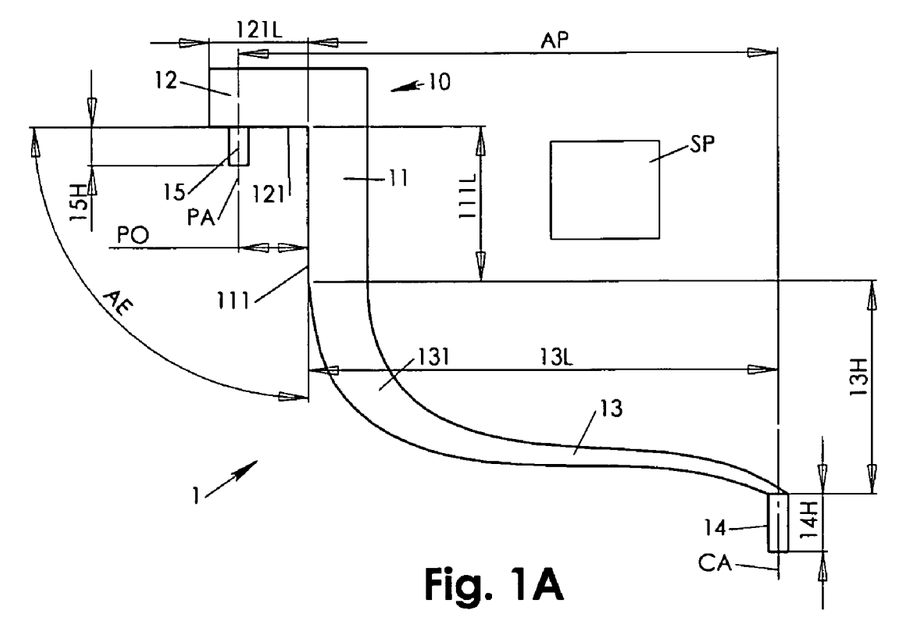
FIG. 1A is a front view of an exemplary cantilever probe of the preferred embodiment parallel a symmetry plane of the cantilever probe.
Figure 1B:
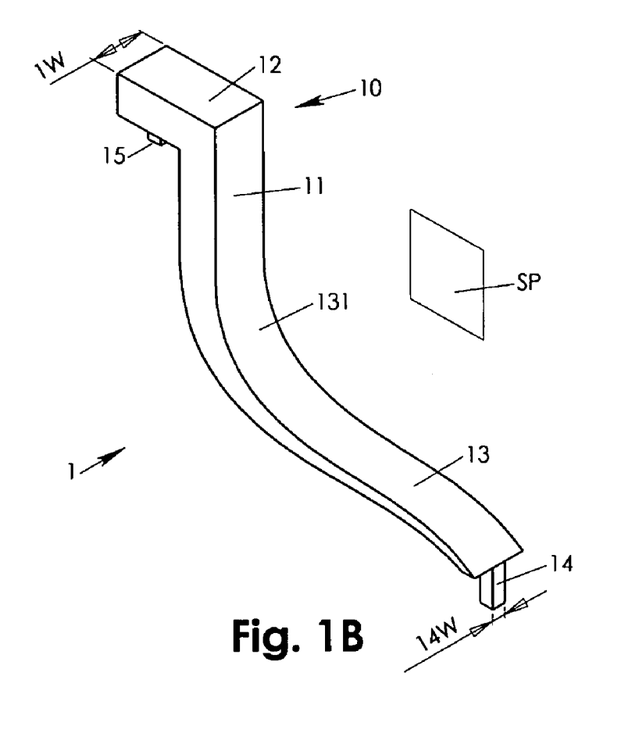
FIG. 1B is a perspective view of the cantilever probe of FIG. 1A.

Referring to FIGS. 1A, 1B, a cantilever probe 1 for test contacting a well known test contact of a tested electronic circuitry along a contacting axis CA may have a tip positioning pin 14 configured for the test contacting. The tip positioning pin 14 may also be configured for an aligning insertion in a respective one of tip pin holes 43A–43N (see FIG. 3) also along the contacting axis CA. The cantilever probe 1 may further feature a cantilever 13 for resiliently holding the tip positioning pin 14 with respect to the contacting axis CA with a predetermined deflection behavior including a well known scrub motion along the symmetry plane SP.

A base arm 11 may rigidly extend from said cantilever probe 13 such that operational deflection of the cantilever 13 leaves a base arm assembly face 111 substantially free of deformation. An offset arm 12 extends substantially rigid from the base arm 11 in a substantially non parallel elbow angle AE defining together with the base arm 11 a fixture elbow 10 for rigidly fixing the cantilever probe 1 preferably via base arm assembly face 111 and offset arm assembly face 122. An elbow positioning pin 15 extends from one of the base arm 11 and the offset arm 12 along an elbow pin axis PA, which is substantially parallel to the contacting axis CA. The elbow positioning pin 15 is configured for an aligning insertion in a respective one of elbow pin holes 23A–23N (see FIGS. 2, 6) together with aligning insertion of the tip positioning pin 14. The base arm assembly face 111 has a length 111L and the offset arm assembly face 121 has length 121L. The contacting axis CA is in a probe pin distance AP to the elbow pin axis PA.

The cantilever 13 may preferably have a bend 131 terminating at the base arm 11, which in turn may preferably extend substantially parallel to the contacting axis CA. In that case, the elbow positioning pin 14 may extend from the offset arm 12.

The cantilever 13, the base arm 11 and the offset arm 12 may have a continuously protruding profile perpendicular with respect to the symmetry plane SP and the contacting axis CA. In such case, the cantilever probe 1 may be fabricated by a masked electro deposition process in which a central layer including the position pins 14, 15 is interposed between profile layers. As a result, the positioning tips 14, 15 may have at least rectangular but preferably square cross section. The cantilever probe 1 may consequently be also substantially symmetric with respect to the symmetry plane SP that coincides with the contacting axis CA and the elbow pin axis PA.

Deflection behavior of the cantilever 13 may be tuned by adjusting the cantilever length 13L, cantilever height 13H, profile width 1W as well as shape and material composition of the cantilever 13 as may be well appreciated by anyone skilled in the art. Furthermore, instead of the cantilever 13 another suspension structure may be employed such as a suspension knee disclosed in the cross referenced U.S. Application, titled "Freely Deflecting Knee Probe With Controlled Scrub Motion". Thereby, the tip positioning pin may be combined with the suspension knee at the contacting face.

Figure 2:
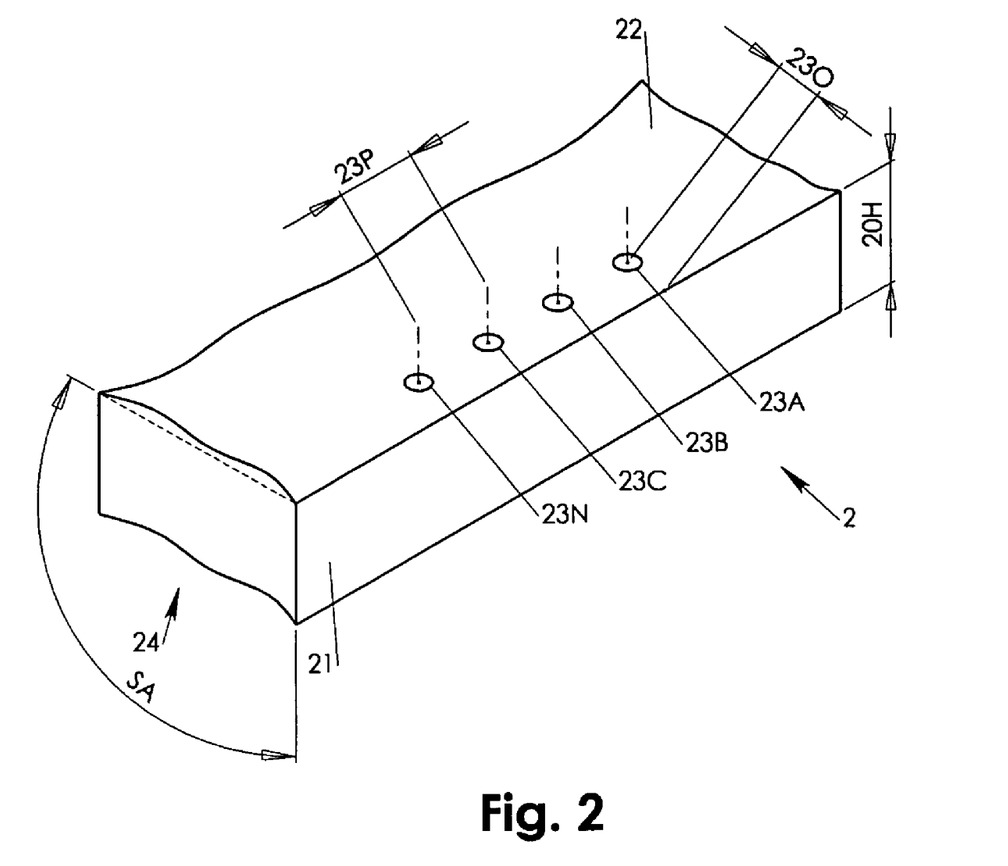
FIG. 2 is the perspective view of a first portion of a fixture plate including two fixture surfaces and elbow alignment holes.

Referring to FIG. 2, a probe fixture plate 2 for fixedly holding a number of cantilever probes 1 may have a first fixture surface 22 featuring a number of primary positioning holes 23A–23N for the aligned insertion of a number of elbow positioning pins 15. The probe fixture plate 2 may additionally feature a second fixture surface 21 in a substantially non parallel fixture surface angle SA to said first fixture surface 22. The fixture surface angle SA corresponds to the elbow angle AE. The second fixture surface 22 preferably extends in substantially constant offset 23O to an array direction of the positioning holes 23A–23N arrayed with positioning hole pitch 23P.

Figure 3:
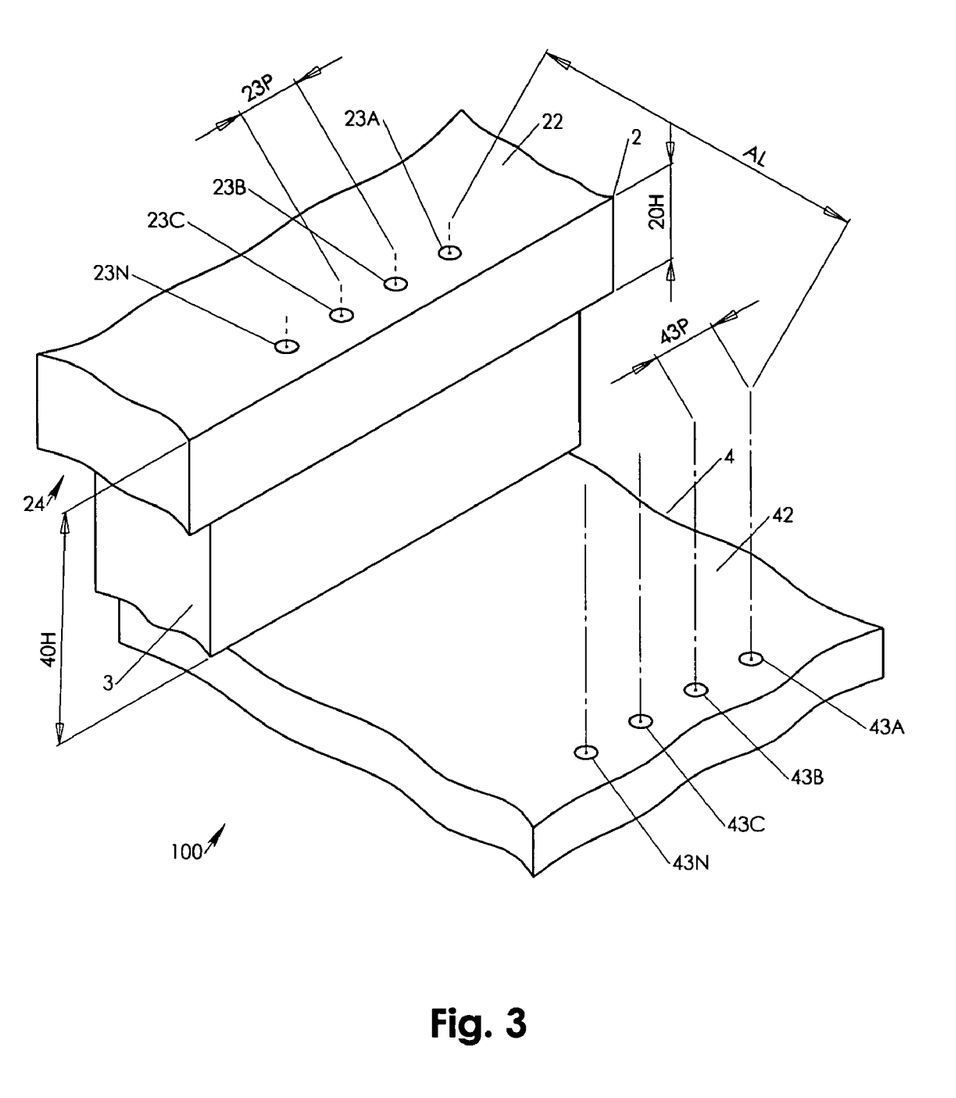
FIG. 3 is the perspective view of the fixture plate of FIG. 2 together with a sacrificial spacing structure and sacrificial assembly plate.

In case the primary elbow positioning holes 23A–23N are linearly arrayed, the second fixture surface 21 may be planar. The fixture surface angle SA may be perpendicular. Referring to FIG. 3, a temporary plate assembly 100 may include a sacrificial assembly plate 4 separable attached to an attachment face 24 of the probe fixture plate 2. The sacrificial assembly plate 4 has a third surface 42 with secondary tip positioning holes 43A–43N in a probe positioning hole offset AL that corresponds to the probe pin distance AP. A secondary hole pitch 43P may be preferably equal or less than the primary hole pitch 23P. The attachment face 24 may be opposite the first fixture surface 22.

The third surface 42 may be in a surface offset 40H to the first fixture surface 22 in direction of the primary holes 23A–23N and secondary holes 43A–43N. In the case where the surface offset 40H is substantially larger than a fixture plate height 20H, a sacrificial spacing structure 3 may be interposed between the probe fixture plate 2 and the sacrificial assembly plate 2. Sacrificial assembly plate 4 and sacrificial spacing structure 3 may be separable by use of a selectively dissolvable solder or other bonding agent as may be well appreciated by anyone skilled in the art.

Figure 4:
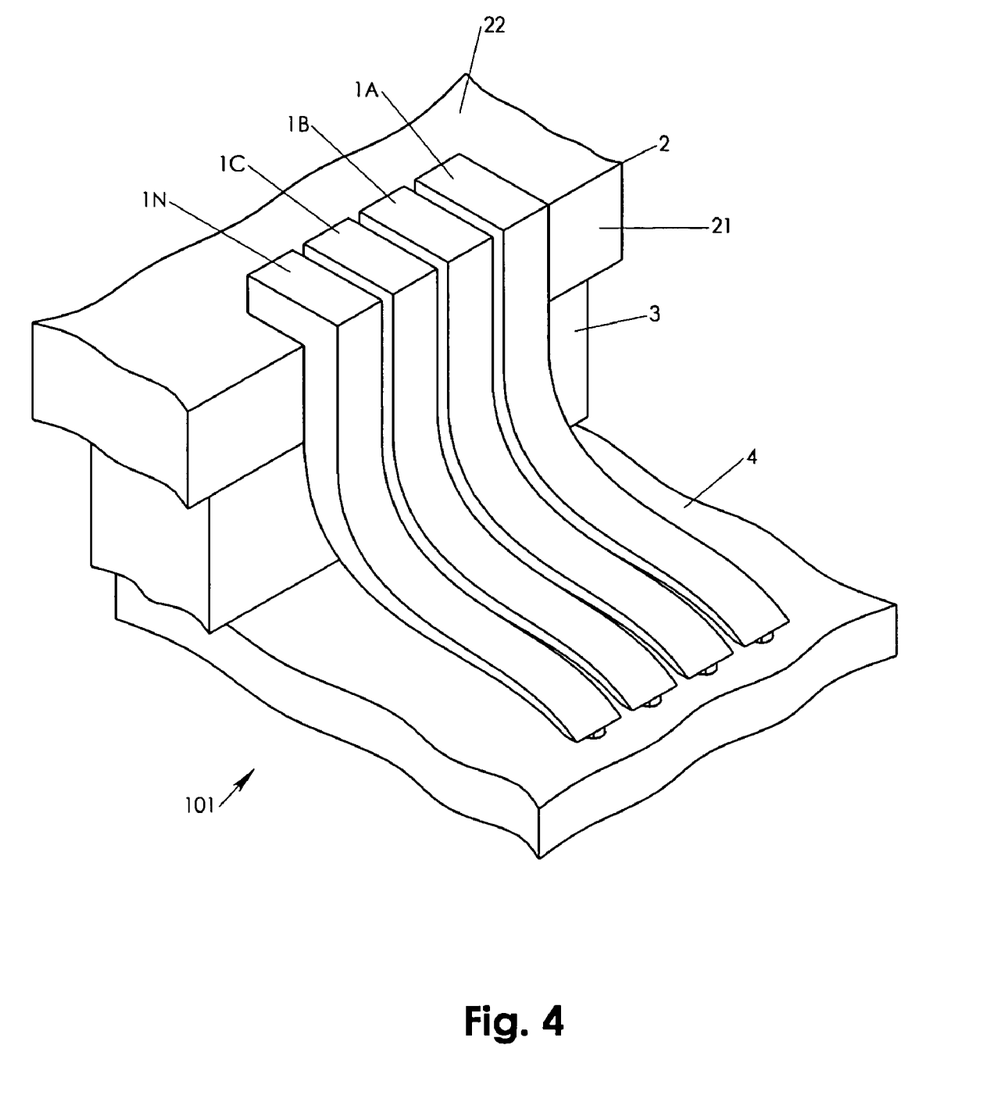
FIG. 4 is the perspective view of the plates of FIG. 3 with a number of assembled cantilever probes of FIGS. 1A, 1B.

Referring to FIG. 4, a probe bonding assembly 101 may include the temporary plate assembly 100 and a number of cantilever probes 1A–1N aligned inserted with their elbow positioning pins 15 in a respective one of the elbow positioning holes 23A–23N and their tip positioning pins 14 concurrently aligned inserted in a respective one of the tip positioning holes 43A–43N. As a result, the base arm assembly face 111 may be brought into a combining proximity with the second fixture surface 21 and the offset arm assembly face 121 may be brought into a combining proximity with the first fixture surface 22. For that purpose, the elbow pin axis PA may be in an assembly face offset PO to the adjacent assembly face that is equal or slightly larger the constant offset 23O between the center of the elbow positioning holes 23A–23N and the second fixture surface 21. In case of the cantilever probe 1 the assembly face offset PO is between offset arm assembly face 121 and the elbow positioning pin 15.

A robotic probe assembling may be accomplished in combination with a vacuum fixture holding a cantilever probe 1 and moving it towards assembly position in direction along the contacting axis CA and elbow pin axis PA. In cases where the scale of the positioning pins 14, 15 is close to the positioning accuracy of the robotic assembly system, a sequential aligned insertion may be accomplished by varying the elbow pin height 15H from the tip pin height 14H. Once a first aligned insertion is accomplished, the second aligned insertion may be attempted without risk of again misaligning the other of the positioning pins 14, 15.

Figure 5:
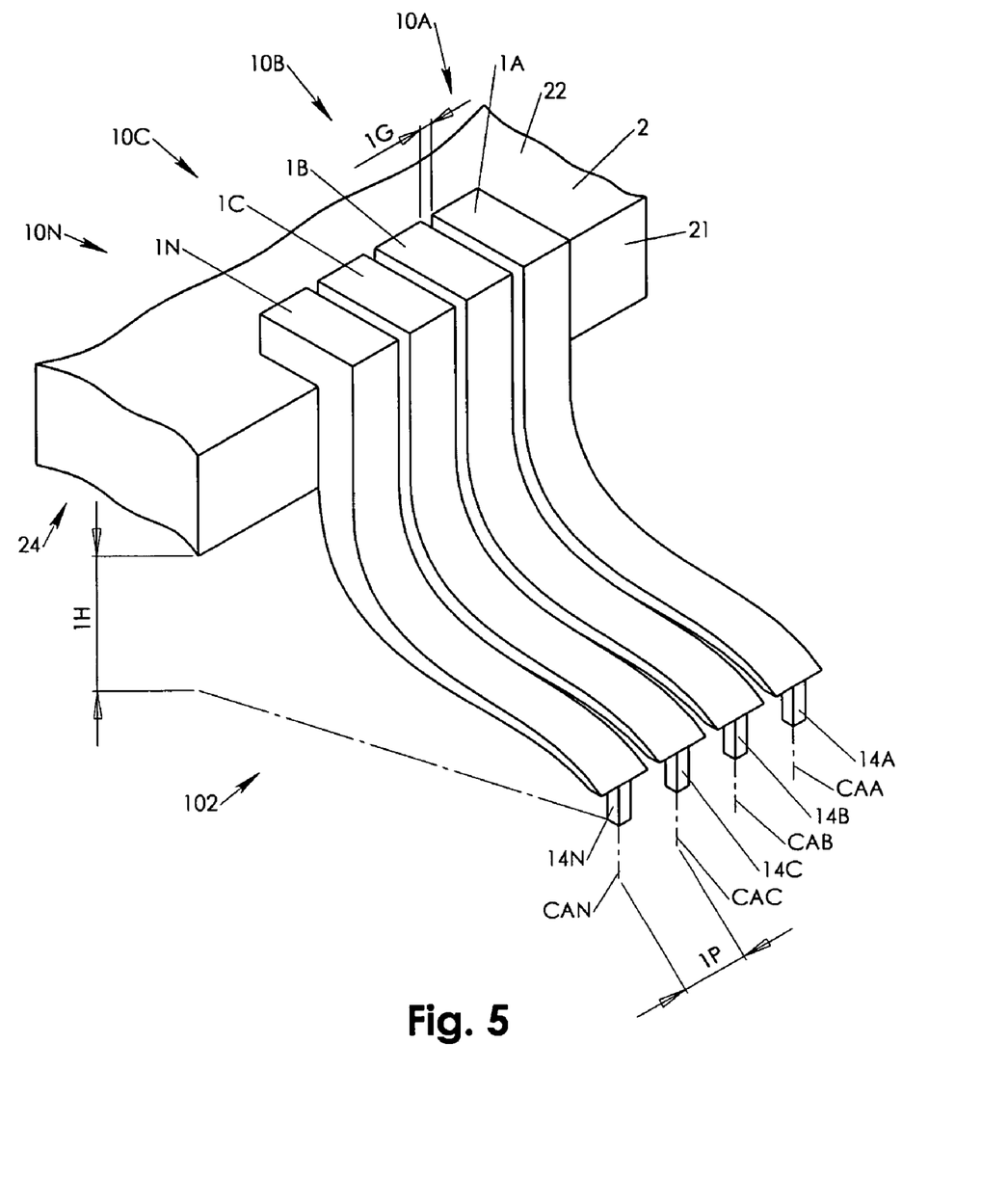
FIG. 5 is the perspective view of assembled probes and fixture plate of FIG. 4 with removed sacrificial spacing structure and sacrificial assembly plate.

Referring to FIG. 5, a fixed probe assembly 102 features a number of cantilever probes 1A–1N fixed with their respective fixture elbows 10A–10N to the fixture plate 2 preferably by applying a combining or bonding agent in the combining proximity between the assembly faces 111, 121 and their respective fixture surfaces 21, 22. A combining or bonding agent may be for example an epoxy or a solder. In case a solder is used, an electrically conductive connection may be simultaneously established between the fixture elbows 10A–10N and eventual conductive traces on one or both of the fixture surfaces 21, 22. Sacrificial assembly plate 4 and eventual sacrificial spacing structure 3 are removed. The tip positioning pins 14A–14N are configured to operate additionally for test contacting along their respective contacting axis CAA-CAN with an eventual scrub motion. For that purpose, the tip positioning pins 14A–14N may be adjusted to a common tip clearance 1H by a sanding operation.

The contacting axes CAA-CAN are in a contacting pitch 1P that corresponds to the secondary hole pitch 43P. In case of linear arrayed elbow positioning holes 23A–23N and planar second fixture surface 21, the cantilever probes 1 may be parallel assembled with constant gap 1G and constant profile width 1W.

The elbow positioning holes 23A–23N may also be arrayed with curvature and the second fixture surface 21 may be concentric as well as the secondary positioning holes 43A–43N being concentrically arrayed with proportionally reduced secondary hole pitch 43P. In that case, the cantilever probes 1 may be arrayed with minimal contacting pitch 1. Furthermore, the probes 1 may have a proportionally decreasing profile width 1 resulting again in a constant probe spacing 1G. Another advantage may be a favorably balanced stress distribution as a result of the profile width 1 increasing proportionally with the distance from the contacting axes CAA-CAN, which corresponds to the bending stress increasing in the cantilever 13 away from the contacting axes CAA-CAN as may be well appreciated by anyone skilled in the art.

The angled fixture is particularly advantageous in minimizing an overall real estate of the fixed probe assembly in perpendicular extension to the contacting axes CAA-CAN. This results on one hand from utilizing the second fixture surface 21 preferably parallel to the contacting axes CAA-CAN, which consumes only a minimal real estate independently of the fixture plate height 20H. The minimized overall real estate results on the other hand from an increased stiffness and thermal stability of the angled fixture due to the three dimensional configuration of the bonding interface between fixture surfaces 22, 21 and the assembly faces 121, 111 together with a reduced combining proximity and minimal use of combining agent. Further more, the bonding interface is free of lateral structures in between adjacent cantilever probes 1, resulting in a maximum profile width 1, which in turn assists in designing suspension structures highly resistant against inadvertent deviating torsion bending.

Figure 6:
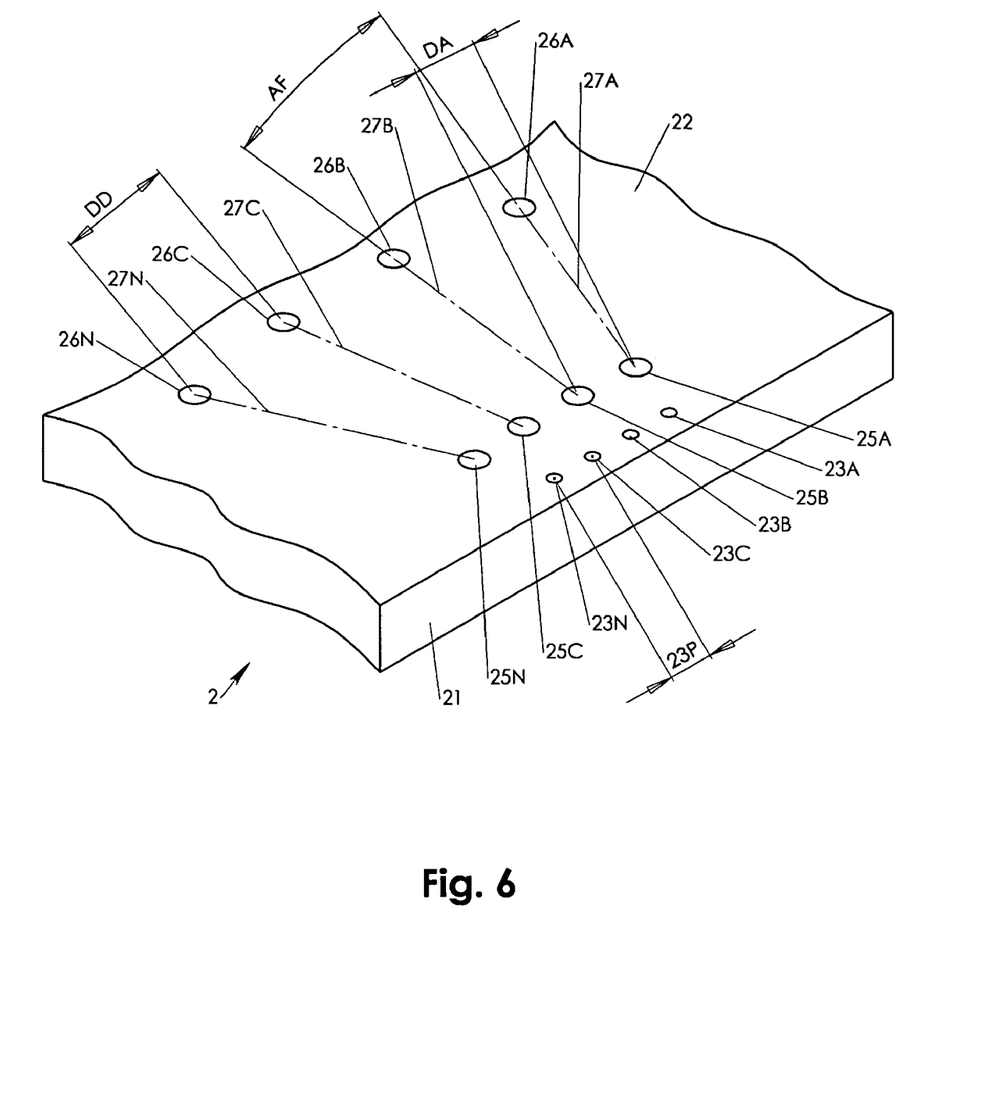
FIG. 6 is the perspective view of a second portion of a fixture plate including the first portion of FIG. 2 and alignment holes for fan-out beams.

Referring to FIG. 6, the first fixture surface 22 may further feature alignment holes 25A–25N and orienting holes 26A–26N. Each of the alignment holes 25A–25N defines with a respective one of the orienting holes 26A–26N one of the positioning axes 27A–27N. The positioning axes 27A–27N may be oriented in a fan-out angle AF with respect to an adjacent one of the positioning axes 27A–27N. Consequently, an alignment hole distance DA between adjacent ones of the alignment holes 25A–25N is substantially smaller than an orienting hole distance DO between adjacent ones of the orienting holes 26A–26N. The alignment hole distance DA is about the same as the positioning hole pitch 23P. The distance of the positioning axes 27A–27N corresponds to a beam pin distance 57 (see FIG. 7).

Particular advantageous is a fabrication step of concurrently drilling all holes 23A–23N, 43A–43N, 25A–25N and 26A–26N without need of intermediate repositioning of the temporary plate assembly 100, which provides for highest hole position accuracies with minimal machining effort. In that way highly individualized probe assemblies may be fabricated in combination with standardized cantilever probes 1 and fan-out beams 5 (see FIG. 7).

Figure 7:
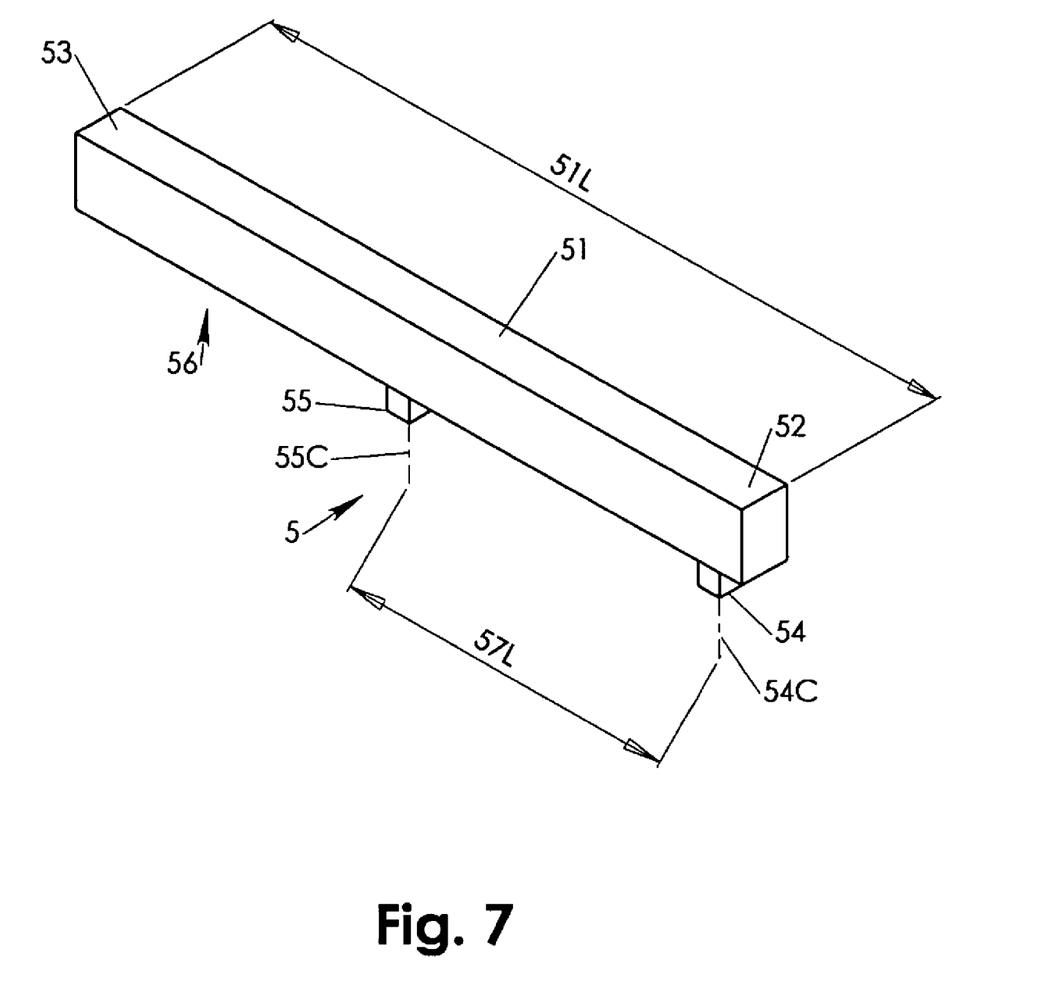
FIG. 7 is the perspective view of an exemplary fan-out beam.

Referring to FIG. 7, a fan-out beam 5 may be fabricated from electrically conductive material with a beam length 51L. The fan-out beam 5 may have a probe connect end 52 and a peripheral connect end 53 on a connect surface 51. Opposite the connect surface 51 may be a beam attachment face 56 featuring an elbow alignment pin in the proximity of the probe connect end 52. A fan-out orienting pin 55 may be with its orienting pin axis 55C in a beam pin distance 57 to alignment pin axis 54C. The fan-out beam 5 may be fabricated similarly like the cantilever probe 1 with a masked electro deposition process in a multi layer fashion.

Figure 8:
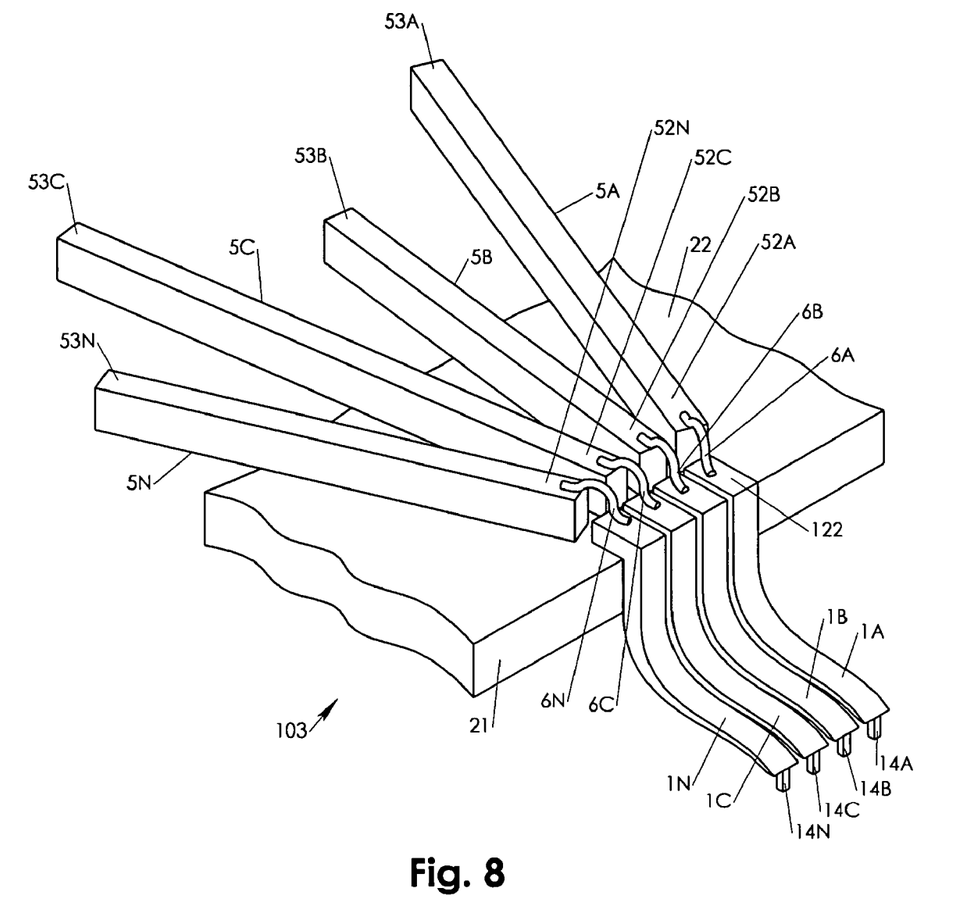
FIG. 8 is the perspective view of the assembled cantilever probes and fixture plate of FIG. 5, the fixture plate of FIG. 6 and a number of assembled fan-out beams of FIG. 7 conductively connected with respective cantilever probes.

Referring to FIG. 8, a probe and fan-out beam assembly 103 features a fixed probe assembly 102 with the fixture plate 2 of FIG. 6 with respect to which a number of fan-out beams 5A–5C are positioned via their elbow alignment pins 54 in respective ones of the alignment pin holes 25A–25N and oriented with their orienting pins 55 in respective ones of the orienting pin holes 26A–26N such that their probe connect ends 52A–52N are in close proximity to respective ones of elbow fixtures 10A–10N. The fan-out beams 5 may be bonded or combined with its attachment face 56 with the first fixture surface 22. Conductive bridges 6A–6N electrically conductive connect fixture elbows 10A–10N with respective ones of the probe connect ends 52A–52N such that a solid conductive path is established between the tip positioning pins 14A–14N and respective ones of the peripheral connect ends 53A–53N. The conductive bridges 6A–6N may be fabricated by well known wire bonding and/or wedge bonding techniques.

The fan-out beams 5 may be alternately lengthened for a zigzag connect end pattern for increased spacing between adjacent ones of the peripheral connect ends 53A–53N, which may be conductively connected to well known assembly contacts of a probe apparatus.

Fixed probe assembly 102 and/or probe and fan-out beam assembly 103 may be part of a probe apparatus for testing electronic circuitry. Fan-out beams 5 and probes 1 may be economically fabricated in large number in a common configuration and combined with individually fabricated fixture plates 2.

Accordingly, the scope of the invention described in the specification above is set forth in the following claims and their legal equivalent:

What is claimed is:

1. A probe for test contacting a test contact along a contacting axis, said probe comprising:
   a. a tip positioning pin configured for said test contacting and configured for an aligning insertion in a tip pin hole along said contacting axis;
   b. a suspension structure combined with said tip positioning pin for resiliently holding said tip positioning pin with respect to said contacting axis with a predetermined deflection behavior;
   c. a base arm rigidly extending from said suspension structure;
   d. an offset arm substantially rigid extending from said base arm in a substantially non parallel elbow angle defining together with said base arm a fixture elbow for rigidly fixing said cantilever probe;
   e. an elbow positioning pin extending from one of said base arm and said offset arm in a direction substantially parallel to said contacting axis, said elbow positioning pin being configured for an aligning insertion in an elbow pin hole simultaneously with said tip pin insertion,
   where the probe is fabricated by a masked electro deposition process in which a central layer including said position pins is interposed between profile layers representing said continuously protruding profile such that said positioning tips have an at least rectangular cross section and such that said cantilever probe is substantially symmetric with respect to a symmetry plane trough said contacting axis and said elbow pin axis.

2. The probe of claim 1, wherein said suspension structure is a suspension knee.

3. The probe of claim 1, wherein said suspension structure is a cantilever.

4. The probe of claim 3, wherein said base arm extends substantially parallel to said contacting axis, wherein said cantilever has a bend terminating in said base arm and wherein said elbow positioning pin extends from said offset arm.

5. The probe of claim 1, wherein said suspension structure, said base arm and said offset arm have a profile continuously protruding in direction perpendicular to said contacting axis.

6. A probe fixture plate for fixedly holding a number of suspension structure probes, said probe fixture plate comprising:
   a. a first fixture surface having a number of primary positioning holes arrayed with a positioning hole pitch;
   b. a second fixture surface in a substantially non parallel fixture surface angle to said first fixture surface, said second fixture surface extending in substantially constant offset to an array direction of said arrayed positioning holes,
   wherein said first fixture surface further comprises at least one alignment hole and at least one orienting hole defining a positioning axis substantially coinciding with a respective one of said primary positioning holes.

7. The probe fixture plate of claim 6, wherein a second of said alignment hole and a second of said orienting hole define a second of said positioning axis in a fan-out angle to said positioning axis such that an alignment hole distance between said alignment hole and said second alignment hole is substantially smaller than an orienting hole distance between said orienting hole and said second orienting hole, and wherein said alignment hole distance is about the same as said positioning hole pitch.

8. The probe fixture plate of claim 6, wherein said primary positioning holes are linearly arrayed and wherein said second surface is substantially planar.

9. The probe fixture plate of claim 6, further comprising a sacrificial assembly plate separable attached to an attachment face of said probe fixture plate, said sacrificial assembly plate having a third surface with a secondary positioning hole in a probe positioning hole offset to a respective one of said primary positioning holes.

10. The probe fixture plate of claim 9, wherein said first fixture surface is substantially perpendicular to said second fixture surface, and wherein said attachment face is opposite said first fixture surface.

11. The probe fixture plate of claim 9, wherein said third surface is in a surface offset to said first fixture surface in direction of said primary holes and said secondary hole.

12. The probe fixture plate of claim 9, further comprising a sacrificial spacing structure interposed between said probe fixture plate and said sacrificial assembly plate.

13. A probe assembly comprising:
   a. a number of arrayed probes, each having:
      I. a tip positioning pin configured for said test contacting along a contacting axis and configured for an aligning insertion in a tip pin hole along said contacting axis;
      II. a suspension structure combined with said tip positioning pin for resiliently holding said tip positioning pin with respect to said contacting axis with a predetermined deflection behavior;
      III. a base arm rigidly extending from said suspension structure;
      IV. an offset arm extending from said base arm in a substantially non parallel elbow angle defining together with said base arm a fixture elbow for rigidly fixing said suspension structure;
      V. an elbow positioning pin extending from one of said base arm and said offset arm in a direction substantially parallel to said contacting axis, said elbow position pin being configured for an aligning insertion in an elbow pin hole simultaneously with said tip pin insertion;
   b. a fixture plate for fixedly holding said number of arrayed probes, said probe fixture plate comprising:
      I. a first fixture surface having an elbow positioning hole;
      II. a second fixture surface in a substantially non parallel fixture surface angle to said first fixture surface, said fixture surface angle corresponding to said elbow angle;
   wherein in said elbow positioning hole said elbow positioning pin is aligned inserted such that assembly faces of said base arm and said offset arm are in combining proximity with respective ones of said first surface and said second surface, and
   wherein said first fixture plate further comprises at least one alignment hole and at least one orienting hole in which a affixed fan-out beam is aligned such that a probe connect end of said fan-out beam is in close proximity to said fixture elbow, and such that a conductive bridge conductively connects said fixture elbow with said probe connect end establishing a solid conductive path between said tip positioning pin and a peripheral connect end of said fan-out beam.

14. The probe assembly of claim 13, wherein said suspension structure is a suspension knee.

15. The probe assembly of claim 13, wherein said suspension structure is a cantilever.

16. The probe assembly of claim 13, wherein said number of probes are fixed with their respective fixture elbow on said first fixture surface and said second fixture surface.

17. The probe assembly of claim 13, further comprising a sacrificial assembly plate separable attached to said fixture plate, said assembly plate having a tip positioning hole with said tip positioning pin being aligned inserted therein.

18. The probe assembly of claim 13, wherein said peripheral connect end is conductively connected to an assembly contact of a probe apparatus.

19. The probe assembly of claim 13 being part of a probe apparatus for testing electronic circuitry.

* * * * *